US011515855B2

(12) United States Patent
Bergmann

(10) Patent No.: US 11,515,855 B2
(45) Date of Patent: Nov. 29, 2022

(54) SAW RESONATOR AND FILTER COMPRISING SAME

(71) Applicant: RF360 EUROPE GMBH, Munich (DE)

(72) Inventor: Andreas Bergmann, Haiming (DE)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 16/645,913

(22) PCT Filed: Sep. 6, 2018

(86) PCT No.: PCT/EP2018/074031
§ 371 (c)(1),
(2) Date: Mar. 10, 2020

(87) PCT Pub. No.: WO2019/052894
PCT Pub. Date: Mar. 21, 2019

(65) Prior Publication Data
US 2020/0280297 A1 Sep. 3, 2020

(30) Foreign Application Priority Data

Sep. 13, 2017 (DE) .......................... 102017121221.3

(51) Int. Cl.
*H03H 9/02* (2006.01)
*H03H 9/25* (2006.01)
(Continued)

(52) U.S. Cl.
CPC .......... *H03H 9/02811* (2013.01); *H03H 9/25* (2013.01); *H03H 9/6416* (2013.01); *H03H 9/725* (2013.01)

(58) Field of Classification Search
CPC .. H03H 9/02; H03H 9/25; H03H 9/64; H03H 9/72; H03H 9/725
See application file for complete search history.

(56) References Cited

U.S. PATENT DOCUMENTS 8,225,470 B1 * 7/2012 Loseu ................. H03H 9/6406
29/25.35
2004/0090145 A1    5/2004 Bauer et al.
(Continued)

FOREIGN PATENT DOCUMENTS

EP            2357728 A1    8/2011

OTHER PUBLICATIONS

Manenti, Surface Acoustic Wave Resonators For Quantum Information, Universita Degli Studi Di Milano, 59 pages. (Year: 2013).*
(Continued)

*Primary Examiner* — Samuel S Outten
(74) *Attorney, Agent, or Firm* — Patterson+ Sheridan, L.L.P.

(57) ABSTRACT

A SAW resonator comprises two reflectors and a transducer arranged between the reflectors. A resonant space between the transducer and a respective reflector is set large enough to enable occurrence of main resonance and at least one further resonance of comparable admittance. Thus, a multiple resonant resonator is achieved that can be used as a parallel resonator in a filter circuit with a DMS track for example to improve attenuation in a stop band.

15 Claims, 16 Drawing Sheets

(51) Int. Cl.
    *H03H 9/64*     (2006.01)
    *H03H 9/72*     (2006.01)

(56) References Cited

U.S. PATENT DOCUMENTS

| 2007/0279157 | A1* | 12/2007 | Bauer | H03H 9/0057 |
| | | | | 333/195 |
| 2010/0259341 | A1* | 10/2010 | Nakai | H03H 9/14535 |
| | | | | 333/193 |
| 2012/0188026 | A1 | 7/2012 | Yamaji et al. | |
| 2017/0194936 | A1 | 7/2017 | Tajima et al. | |

OTHER PUBLICATIONS

International Search Report and Written Opinion dated Feb. 27, 2019, corresponding to Application No. PCT/EP2018/074031.

* cited by examiner

—— P22 von REF
—— P11 von IDT
--- P13 von IDT
---- real part { Y11 } of resonator — P22 von REF
— P11 von IDT
--- P13 von IDT
---- real part of Y11 [dB]

— P22 von REF
— P11 von IDT
--- P13 von IDT
⋯ real part of Y11 [dB]

SAW RESONATOR AND FILTER COMPRISING SAME

CROSS-REFERENCE TO RELATED APPLICATIONS

This application is a national stage application under 35 U.S.C. 371 of PCT/EP2018/074031, filed Sep. 6, 2018, which claims the benefit of German Application No. 10 2017 121 221.3, filed Sep. 13, 2017, both of which are incorporated herein by reference in their entireties.

A SAW structure comprises fingers that can be transducer fingers or reflector fingers. The reflection of the fingers is an important parameter that has to be taken into account when designing a filter comprising the SAW structure. When regarding the reflection of a number of such fingers that are arranged in a uniform longitudinal grid the reflection function of the reflector shows a stop band according to the pitch of the fingers and further comprises a number of local minima that can be observed near the stop band. These local minima of reflection appear with relative small mutual distances in frequency and are not very distinct. Therefore, new local maxima of conductance that are assigned to further resonances arise. Frequency distances and amplitudes are depending only from reflection, number and distances of the fingers.

BRIEF SUMMARY OF THE INVENTION

When looking on a resonator comprising a transducer that is arranged between two reflectors it has been an object of all former design effort to reduce the further resonances by providing a chirped finger period in a transition area between two adjacent SAW structures and to provide a very distinct main resonance of a high Q factor. A further object has been to provide a resonator admittance having a frequency range at least as wide as the passband of the filter with an optimal flat admittance course within the passband range. Dependent on using the resonator either as a series resonator or as a parallel resonator this flat interval should extend over both sides of the resonator's resonance frequency or extend above it. Only by this way it has been possible to provide an optimal flat pass band when using the resonator in a ladder type arrangement of resonators.

DMS filters are used to provide a filter with low insertion loss and high bandwidth. At the same time the right skirt of the pass band is flat and the selectivity against frequencies above but near the pass band is only bad.

Different ways to compensate for this disadvantage of DMS filters have been proposed. The design of the DMS filter can be optimized for improving the upper stop band. However, insertion losses in the pass band increase at the same time. Alternatively one or more resonators of a ladder type structure can be circuited in series to the DMS filter either in front of the filter or behind it. A series resonator between filter and an antenna can improve the stability against incoming high power signals but improves the selectivity of the filter only within a small frequency range around its antiresonance frequency. Moreover, a general problem of additional filter elements in a filter circuit is the enhanced area required by these additional elements. Further, an additional parallel resonator with a resonance frequency above the passband has only a restricted band width and can improve the filter selectivity in a small frequency range only. As consequence several parallel resonators would be required.

Hence it is an object of the invention to provide a new SAW filter structure that avoids the above mentioned disadvantages.

This and other objects are met by a SAW resonator according to claim 1. Further embodiments as well as a band pass filter comprising such a resonator are given by further claims.

A SAW resonator is proposed that provides at least one further resonance of an admittance comparable to the admittance of the main resonance. Such a SAW resonator having at least two comparable resonances is made as large as required to make occur the at least one further resonance. More resonances are possible with larger resonant spaces as reflected waves do have more possibilities to interfere constructively. Without deviating too much from the resonator design a broader resonant space can be achieved by allowing the acoustic wave to penetrate deeper into transducer and/or reflector. To do so, the reflection of the outermost fingers has to be reduced such that a total reflection requires more reflecting fingers than before.

According to an embodiment a local finger period is defined to describe the distance between the centers of two adjacent fingers. A transition region located between the transducer and a respective one of the two reflectors is defined and comprises a number of outermost fingers of one or both of transducer and respective reflector. In each of the both transition regions the local finger period is chirped such that a local minimum of the local finger period forms in each transition region.

A chirp defines stepwise but continuously increasing or—like in the present case—decreasing the local finger period. In the transition region the different local finger periods hinder the wave reflected at a respective finger pair to constructively interfere with the incoming wave. Thereby the reflection at the acoustic port of the resonator is reduced. Reduced reflection increases the amount of unreflected wave and increases the length the wave can intrude into the respective element that is into the transducer or the reflector. Thereby resonance condition for one or more further resonances are fulfilled.

In the embodiment the transition region of the resonator has a region with decreasing finger period until reaching a local minimum followed by an increasing finger period extending till the end of the transition region.

A number of fingers forming the transition region sufficient to produce multiple resonance therein starts from 10 fingers, the fingers being chosen from reflector fingers and transducer fingers. The transition region can comprise up to 40 fingers. A greater transition region is possible but does not attribute any further positive effect.

In a further embodiment the mean finger period $P_{RM}$ of a respective reflector is greater than the mean finger period $P_{TM}$ of the transducer and $1.05\ P_{TM} > P_{RM} > 1.00\ P_{TM}$.

The resonator can have a symmetric structure with a symmetry plane in the middle of the transducer wherein the two minima of the local finger period are situated at the interfaces between each of the reflectors and the transducer.

However it possible too to design a resonator having two different transition regions with different chirp and/or different length that is different number of included fingers. Also other elements of the resonator may be arranged or formed asymmetrically. By breaking the symmetry of the resonator further maxima of the resonator's admittance can be created.

A transition region can be limited to the outermost fingers of one of two adjacent resonator elements chosen from reflector and transducer. Hence, the region with falling and raising finger period and the local minimum is localized within the same resonator element.

However, arranging the local minimum at the interface between two resonator elements is preferred.

According to another embodiment the transition region comprises a first number $NF1_{Ref}$ of reflector fingers and a second number $NF2_{IDT}$ of transducer fingers, wherein $NF1_{Ref} < NF2_{IDT}$. The local finger period of the transducer has a maximum in the middle of the transducer. However, the respective slope of the local finger period between the transition region and the middle of the transducer is lower than the slope thereof in the transition region. That is, the chirp is smaller in the region of the transducer that is not the transition region. Accordingly, chirps may be different on both sides of the middle of the transducer.

Similarly, the local finger period in a reflector may have a maximum at the beginning of the transition region, and may have a slope towards the outer end that faces away from the transducer where local finger period has a value below the above maximum. The chirp in the non-transition region of the reflector may be opposite to the chirp in the transition region or may have another slope.

It has been found that the value of the local minimum of the resonator's local finger period has substantial impact on the number and distinctness of the additional resonance maxima of the resonator. According to preferred embodiments the local finger period in the transition region varies between a maximum $p_{max}$ and a minimum $p_{min}$ and the values thereof comply with the relation $0.85 \ p_{max} \leq p_{min} < p_{max}$.

Preferred values for $p_{min}$ relative to $p_{max}$ are at or near $0.9 \ p_{max}$.

A proposed resonator may be used as a parallel resonator in a filter circuit of any kind. By the multiple resonances of the parallel resonator a multiple of poles can be created. Thereby improved attenuation of the filter admittance at desired frequencies can be achieved to improve the selectivity thereof. Whereas up to now several parallel resonators with one distinct resonance only have been required to solve specific attenuation problems the same effect can now be achieved with one resonator only having multiple resonances. Main advantage of the new resonator is the reduced area on the resonator's filter chip. In the 1 GHz domain where filter structures need more area on a chip this advantage is still more important. Moreover, a filter using the single multiple-resonant parallel resonator shows a reduced insertion loss when compared with a ladder-type arrangement of several single-resonant resonators because of the reduced static capacitance. As a consequence the transformation path of a shunt coil to compensate this capacitance is reduced and the losses in the coil are also reduced.

A preferred filter circuit comprises a DMS filter and a parallel resonator of the described kind. The parallel resonator is designed such that its multiple resonances produce poles and hence improved attenuation in the upper stop band. The finger period of the new parallel resonator is chosen smaller than the finger period of a respective series resonator and a respective parallel resonator of known filter devices. The latter ones have resonance frequencies below the pass band of the filter, or, when combined with a series coil within the pass band.

A band pass filter circuit of an exemplary embodiment comprises a first series resonator connected to the input of the filter at an antenna side thereof in series to a DMS track. A parallel resonator having multiple resonances is arranged in a parallel branch of the signal line at the output of the DMS track. The mean finger period of the parallel resonator is chosen smaller than the mean finger period of the series resonator and is assigned to a frequency above the pass band of the DMS track. The series resonator provides improved power durability. The parallel resonator improves attenuation in the upper stop band of the filter circuit.

Preferably the filter circuit with the new parallel resonator having multiple resonances is used as an Rx filter within a duplexer. The parallel branch with the parallel resonator is arranged at the Rx output side of the circuit.

The filter circuit is advantageously used to operate in the 1 GHz domain that is at frequencies from about 500 MHz to 1 GHz.

The parallel resonator may be used in a multiport resonator (MPR) comprising a number of single interdigital SAW transducers that are mutually circuited in series and parallel. One or more of the single transducers may be embodied according to the transducer of the invention having an elongated transition region with a chirp of the finger-to-finger distance. A multiport resonator can be operated and behaves like a single resonator.

BRIEF DESCRIPTION OF THE SEVERAL VIEWS OF THE DRAWINGS

In the following the invention is described in more detail with reference to embodiments and the accompanied figures. The figures show calculated results as well as schematic block diagrams of a filter circuit and its components.

DETAILED DESCRIPTION OF THE DRAWINGS

Figure 1:
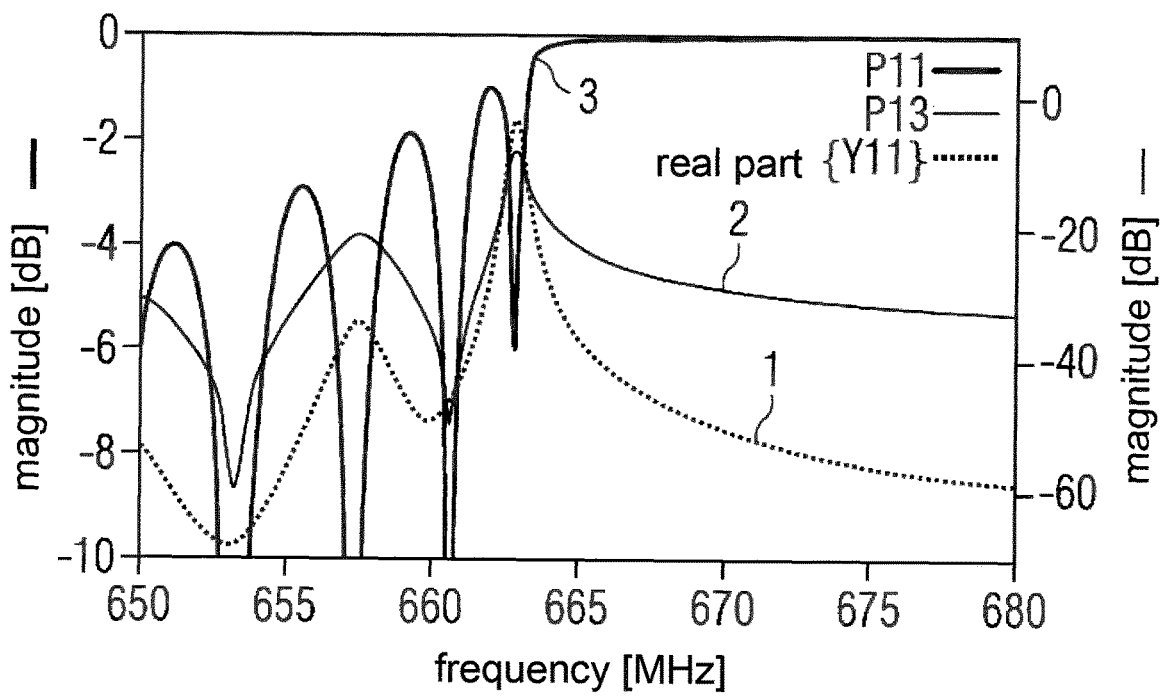
FIG. 1 shows the characteristics of a uniform grid of reflecting fingers

FIG. 1 shows the characteristics of a uniform grid of 110 reflecting fingers that may be fingers of a transducer (IDT) or of a reflector. Curve 1 depicts conductance, curve 2 transducer transfer function and curve 3 the reflection thereof. The latter one shows a stop band according to the finger period of the grid and further comprises a number of local minima that can be observed near the stop band. These local minima of reflection appear with relative small mutual distances in frequency and are not very distinct. Therefore, new local maxima of conductance that are assigned to further resonances arise. Frequency distances and amplitudes are depending only from reflection, number and distances of the fingers.

Figure 2:
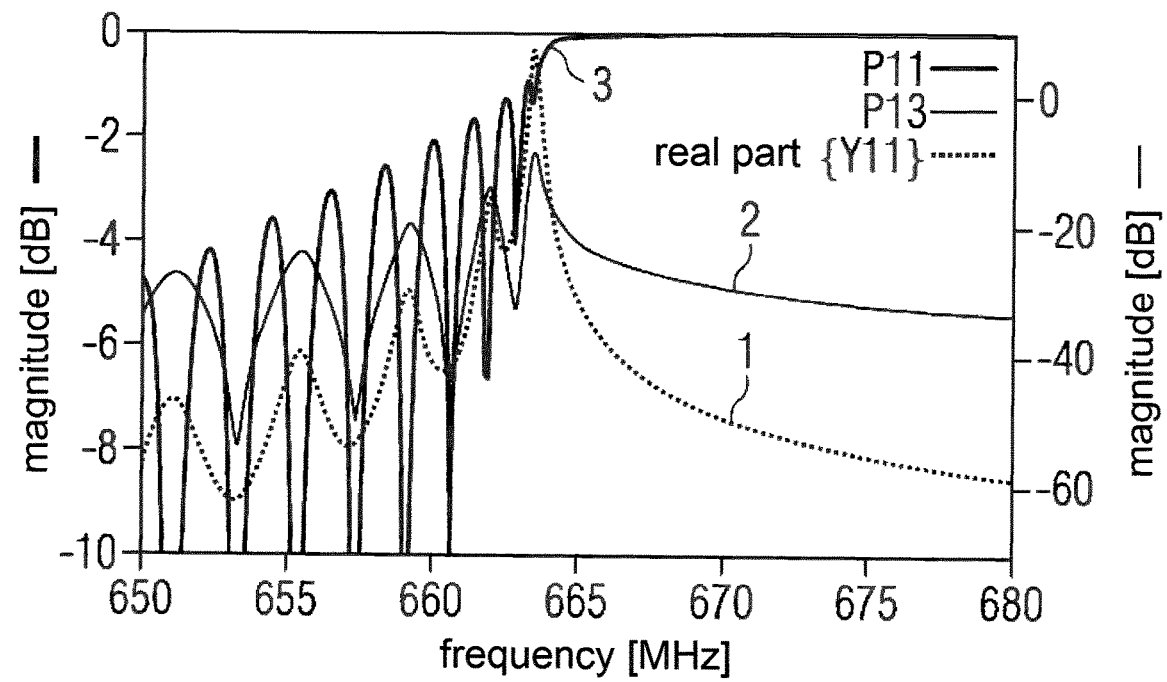
FIG. 2 shows the characteristics of a uniform grid with a higher number of fingers

FIG. 2 shows the characteristics of a uniform grid of 220 reflecting fingers that may be fingers of a transducer (IDT) or of a reflector. Curve 1 to 3 depict the same characteristic parameters as shown in FIG. 1. It can be seen, that the doubled number of reflecting fingers produces more local minima of conductance (curve 2).

Figure 3:
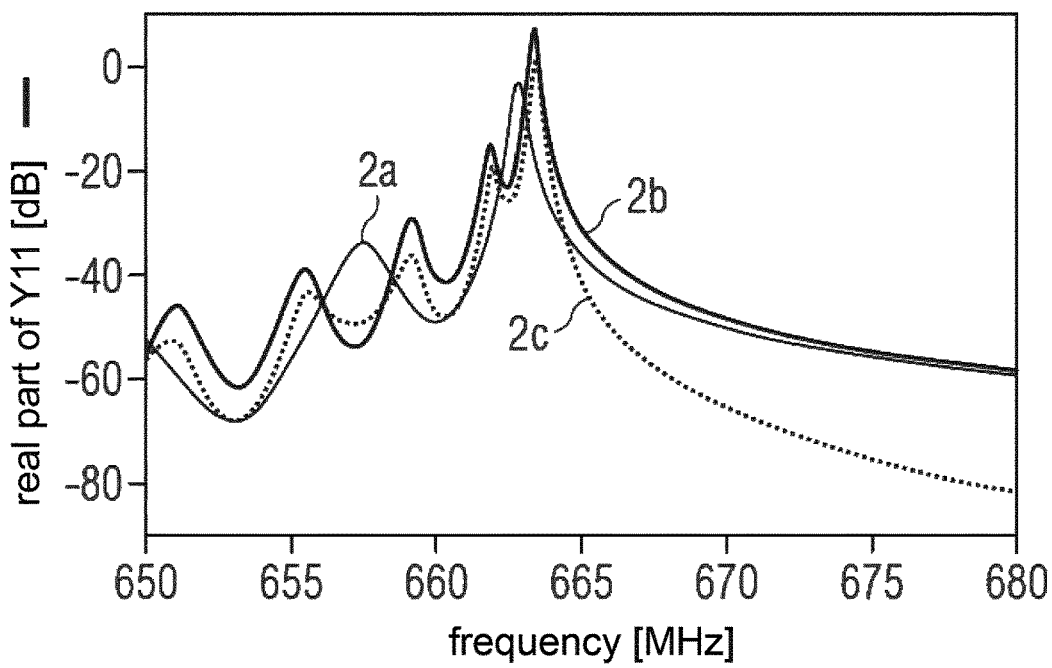
FIG. 3 shows the conductance of uniform grids having different length with and without reflectors

FIG. 3 compares conductances of a grid of 110 fingers (curve 2a), of a grid of 220 fingers (curve 2b) and of a resonator (curve 2c) having a transducer with 110 fingers and two reflectors having 55 fingers each. From this figure it can be concluded that a structure according to curve 2c is more attractive for a usage in a low loss filter as conductance beyond the resonance frequency is substantially lower as in curve 2b.

Figure 4:
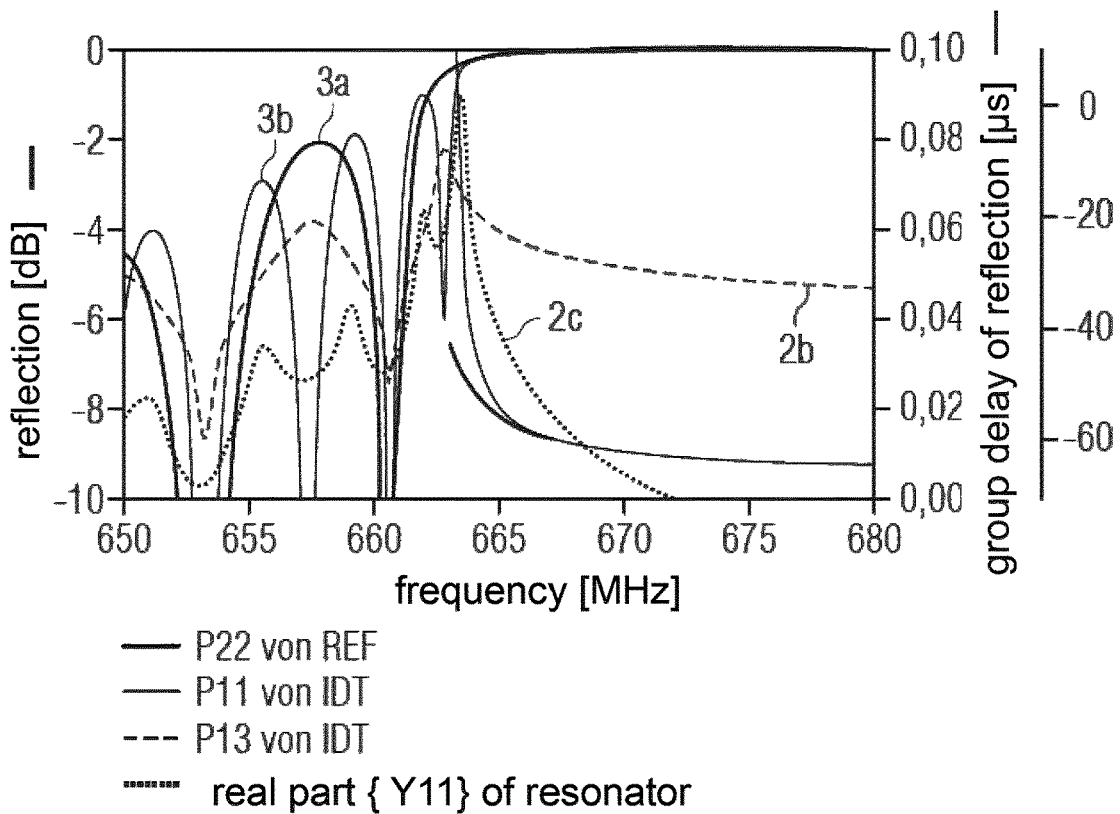
FIG. 4 shows the characteristics of a uniform resonator

FIG. 4 shows characteristics of a uniform resonator with 55-110-55 fingers in reflector and IDT (conductance 2c), as well of the used reflector (reflectance 3a) and IDT (transducer transfer function 2b, reflectance at acoustic port 3a) regarded separately.

Figure 5A:
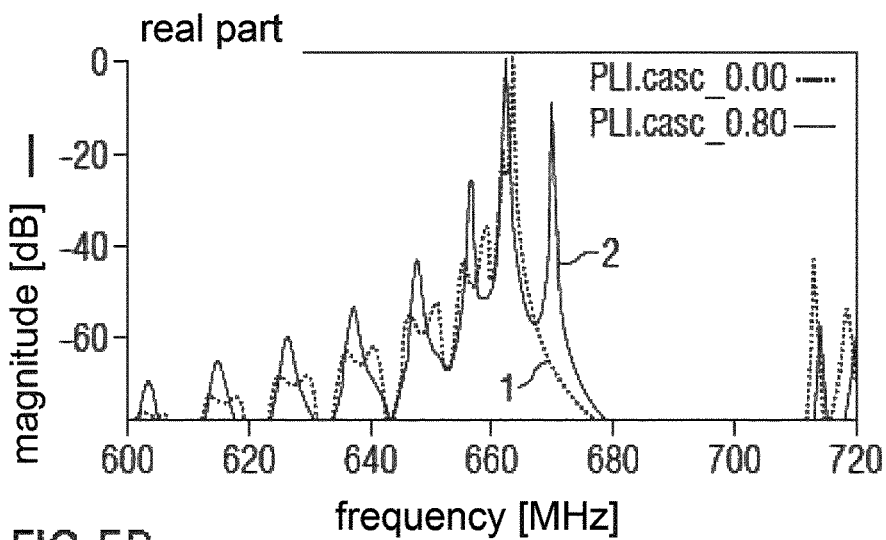
FIG. 5 shows the admittance of resonators with reflectors and transducer having uniform distributed fingers but an additional distance in between them
Figure 5B:
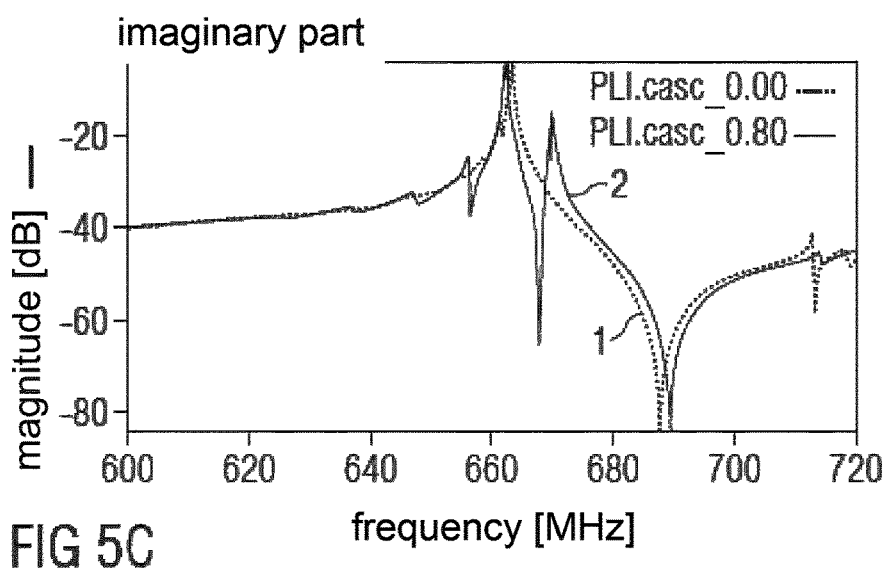
Figure 5C:
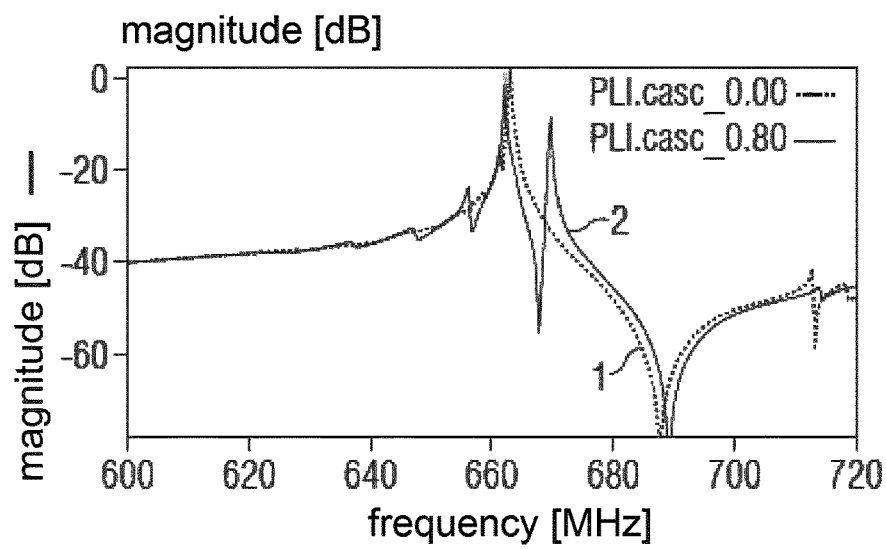

FIG. 5 shows in curve 1 the admittance of a resonator with reflectors and transducer having uniform distributed fingers (55-110-55 fingers) and of the same resonator with an additional distance between IDT and reflectors of 0.8 times the mean finger period in curve 2. The three different diagrams a) to c) show real part, imaginary part and magnitude of admittance. It can be seen that an additional and distinct new resonance has formed in curve 2 at the right side of the original resonance shown in curve 1. The main resonance is slightly shifted to a lower frequency.

Figure 6:
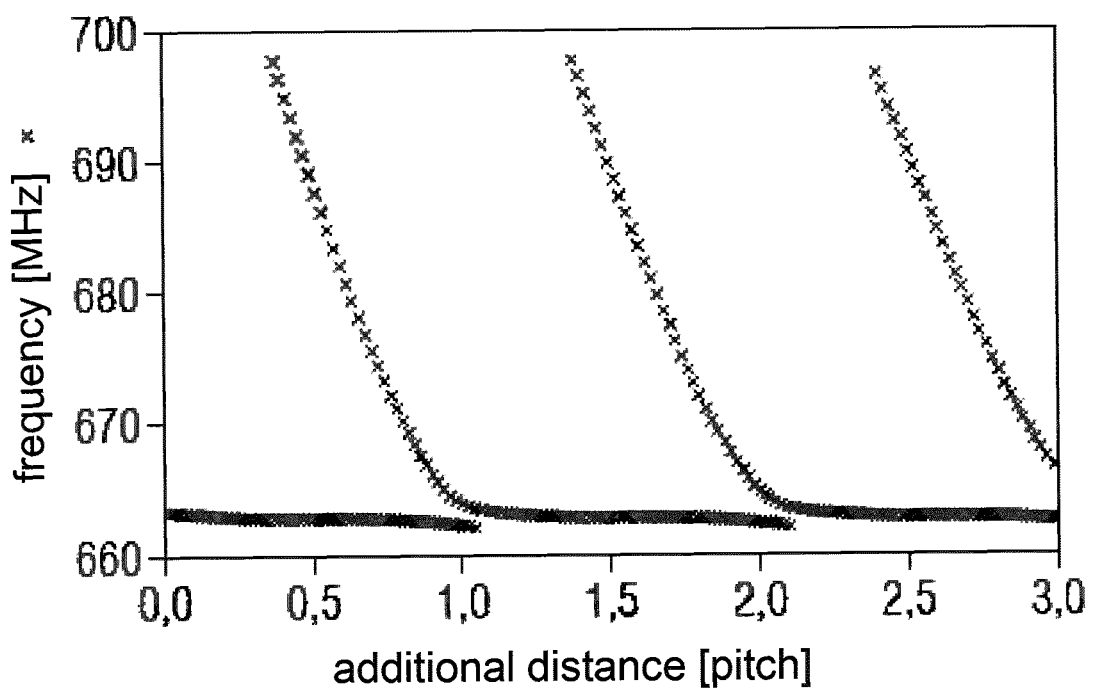
FIG. 6 shows the resonance frequencies of uniform resonators with an additional distance between transducer and reflector

FIG. 6 shows the course of the resonance frequencies of the above described uniform resonator with an additional distance between transducer and reflector in dependence of said distance. The distance is given in multiples of mean finger period. It can be seen that the difference between two resonances decreases with higher distance till one resonance disappears and a new resonance arises.

Figure 7A:
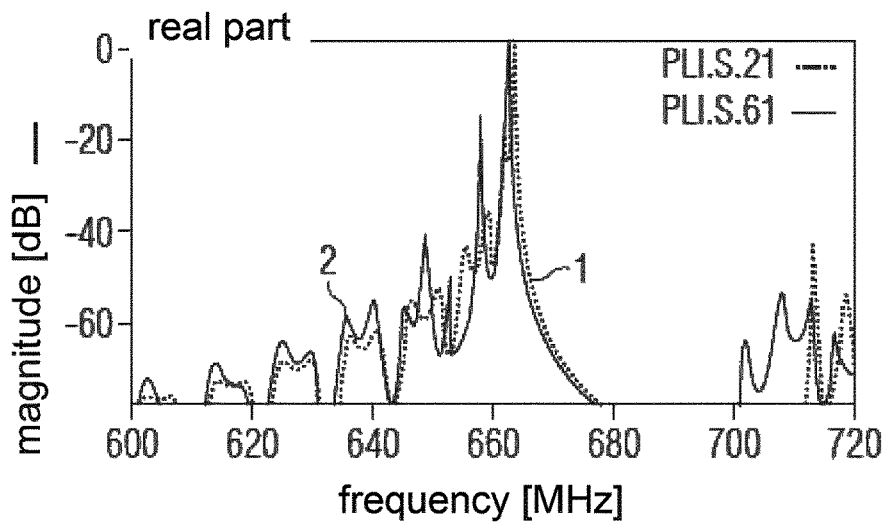
FIG. 7 shows the admittance of resonators with different finger periods at transducer and reflector and uniform distributed fingers
Figure 7B:
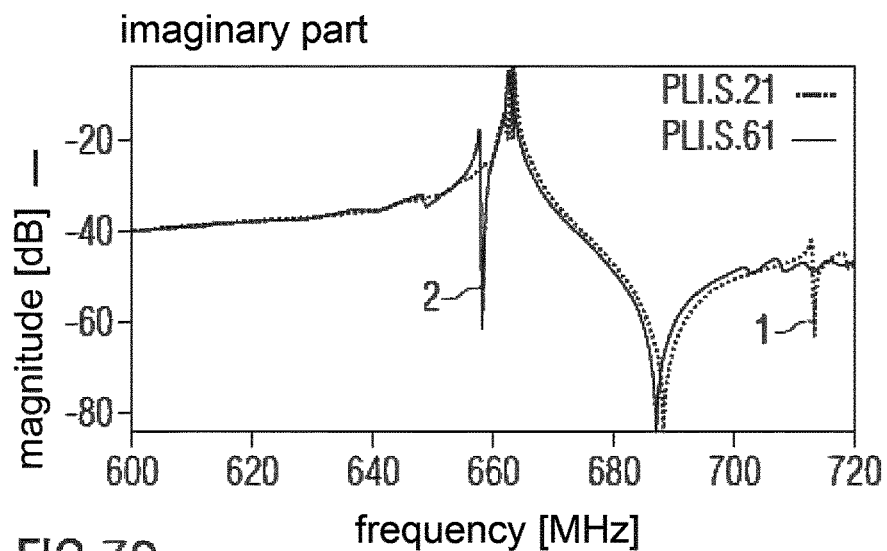
Figure 7C:
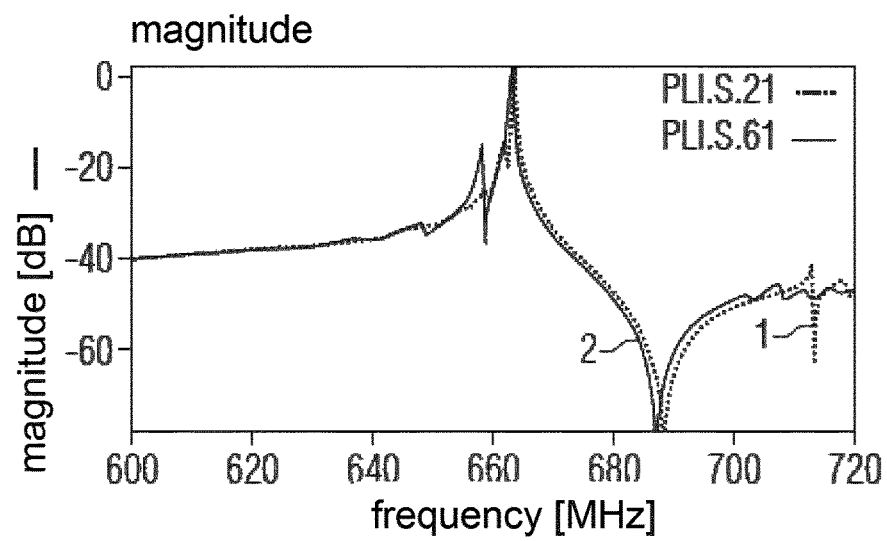

FIG. 7 shows the admittance of a resonator (55-110-55 fingers) with different finger periods at transducer and reflector and uniform fingers structure (curve 1) and the admittance of the same resonator having a linearly chirped transition region between IDT and each of the reflectors. The three diagrams a) to c) show real part, imaginary part and magnitude of admittance. The finger period $p_{REF}$ of reflector is 1.02 times the finger period $p_{IDT}$ of IDT. The transition region comprises 20 fingers in each of reflector and IDT. Curve 2 shows the additional resonance more distinctly below the main resonance.

Figure 8A:
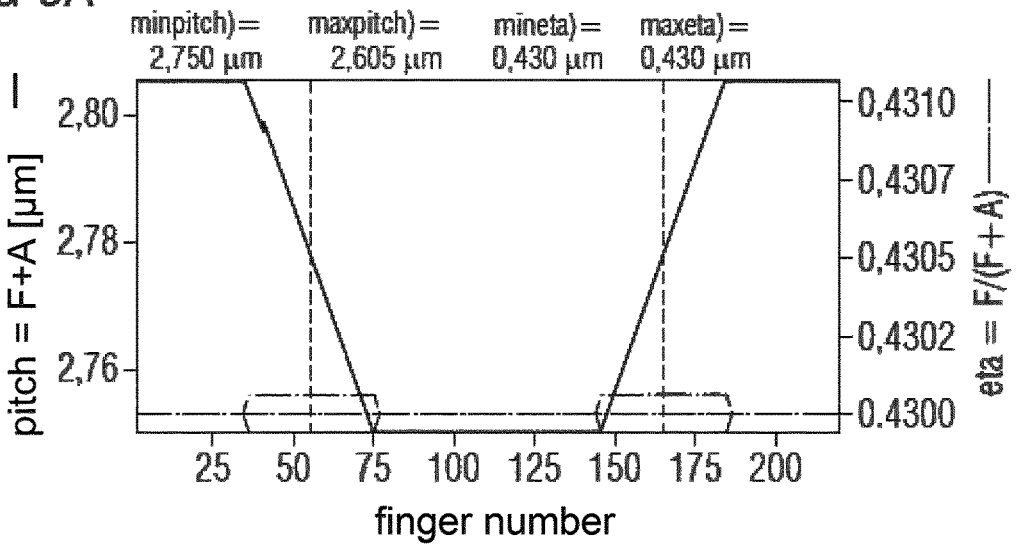
FIG. 8 shows different depictings of the finger structure of a resonator with linear chirp and different finger period at transducer and reflector
Figure 8B:
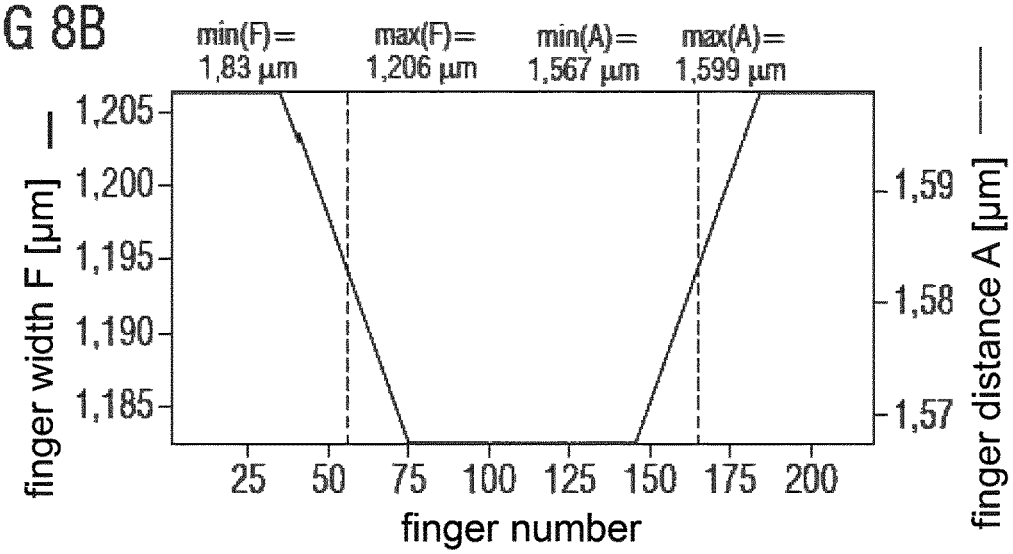
Figure 8C:
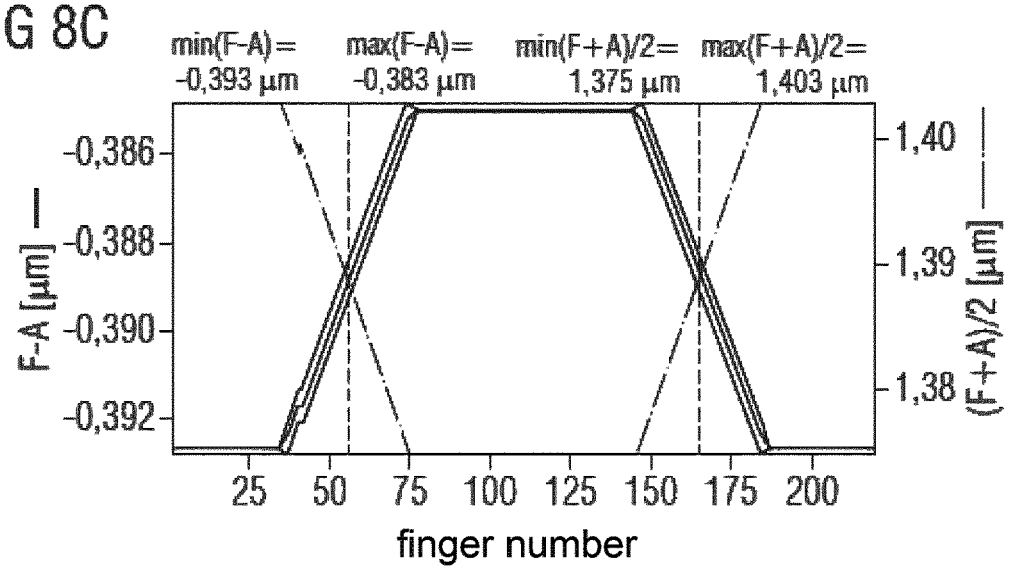

FIG. 8 shows the finger structure of a resonator with linear chirp and different finger period at transducer and reflector. The three diagrams a) to c) show different depictions of the geometric parameters relevant for width and distance of fingers. The upper picture shows the local finger period given in dependence of the number of the fingers where finger number 1 complies with the outermost finger of a reflector. The dotted vertical lines separate a respective reflector and the transducer. Hence each reflector of this example has 55 fingers and the transducer has 110 fingers.

Figure 9:
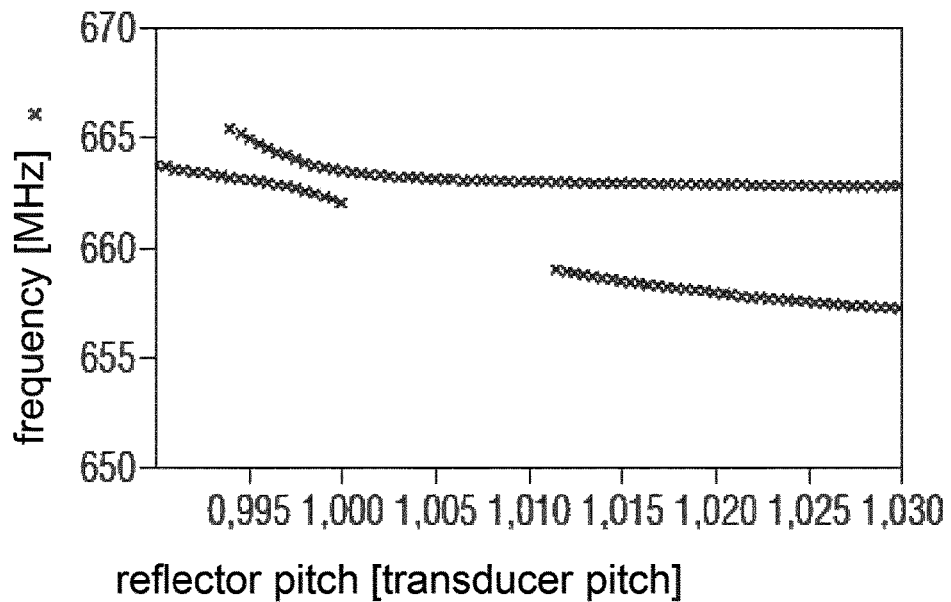
FIG. 9 shows the resonance frequencies of resonators having linear chirp and different finger period in transducer and reflector in dependence of the relation of the finger periods in transducer and reflector

FIG. 9 shows the resonance frequencies of a resonator as described above in FIG. 8 (having linear chirp and different finger period in transducer and reflector) in dependence of the relation of the finger periods in IDT and reflector with a course of the local finger period similar to that shown in FIG. 8. It can be seen that the additional resonance does not appear at all relations $p_{REF}/p_{IDT}$.

Figure 10:
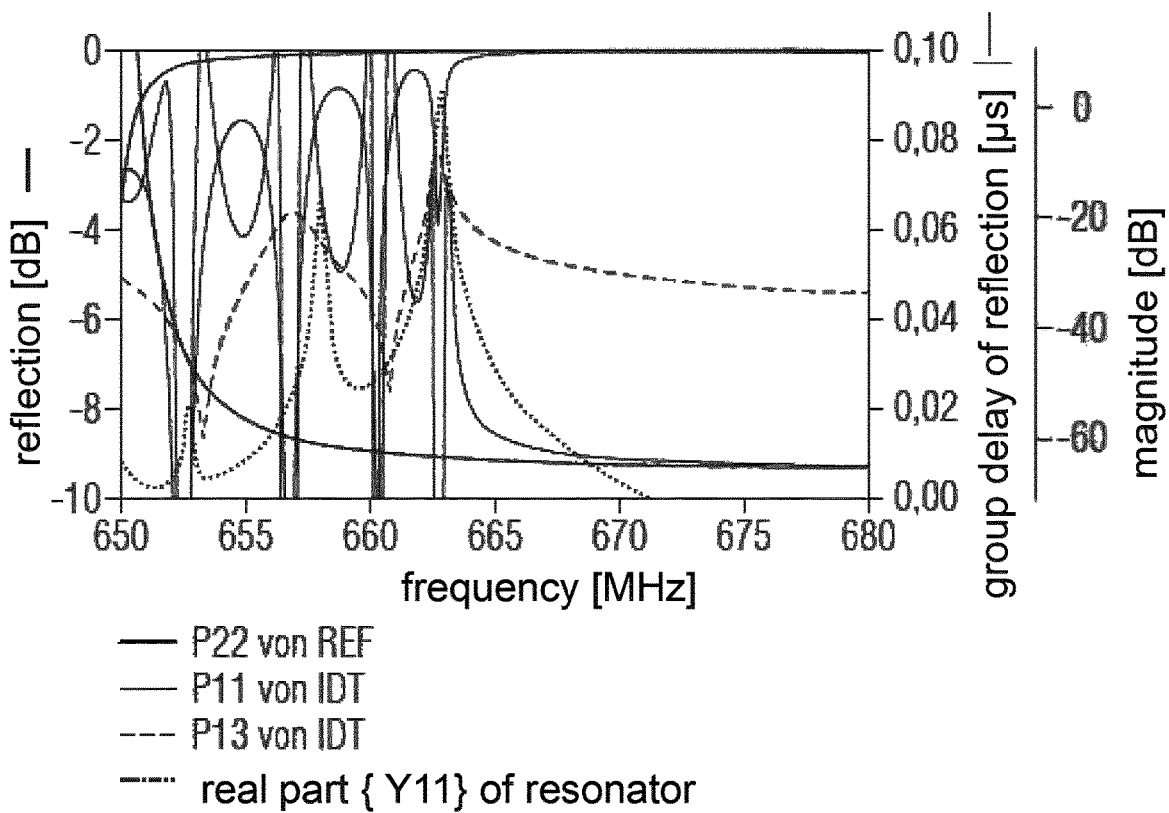
FIG. 10 shows the characteristics of a reflector and a transducer with different finger periods and linear chirp

FIG. 10 shows the characteristics of a resonator (55-110-555 fingers), its reflector and its transducer. The resonator has different finger periods $p_{REF}/p_{IDT}$ and a linear chirp as shown in FIG. 8. The relation $p_{REF}/p_{IDT}$ is set to be 1.02.

Figure 11A:
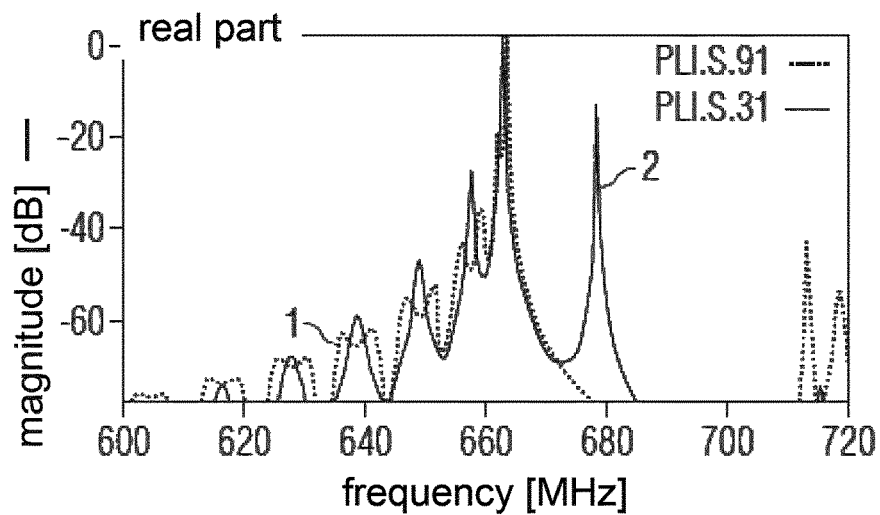
FIG. 11 shows the admittance of resonators having the same finger period in transducer and reflector and linear chirp with a local minimum
Figure 11B:
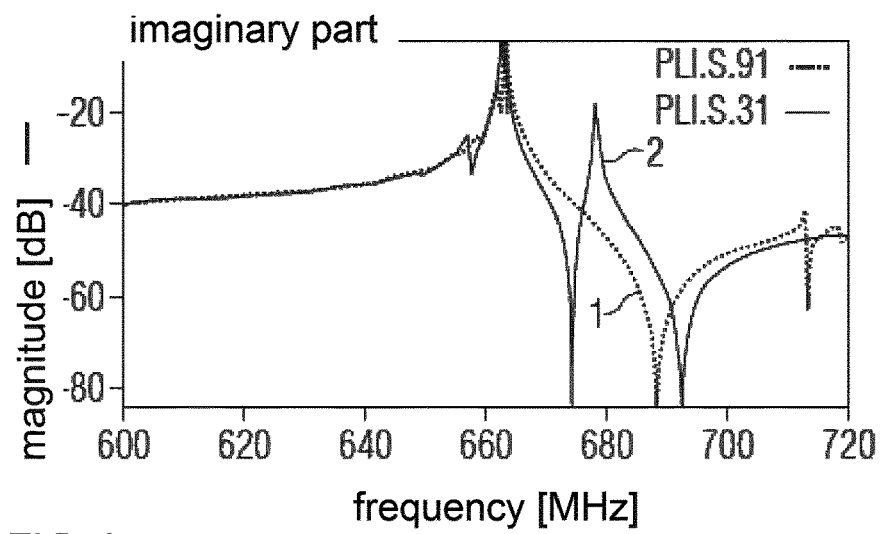
Figure 11C:
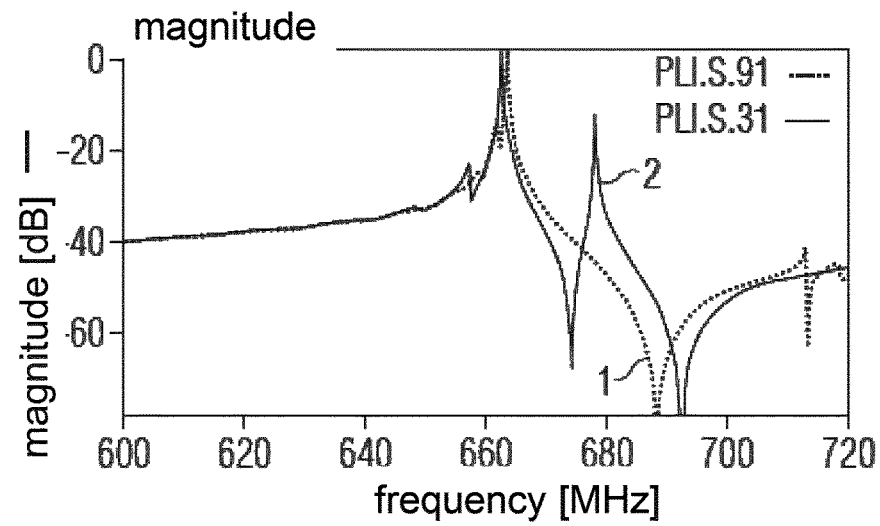

FIG. 11 shows the admittance of resonators (55-110-55 fingers) having the same finger period in transducer and reflector and compares a uniform resonator (curve 1) with a resonator having a linear chirp of 5 fingers in each of IDT and reflector with a local minimum in the middle of the transition region (curve 2). The three different diagrams a) to c) show real part, imaginary part and magnitude of admittance. The minimum finger period at local minimum is about 0.9 the mean finger period $p_{IDT}$ of the IDT. Curve 2 shows an additional resonance above the main resonance.

Figure 12A:
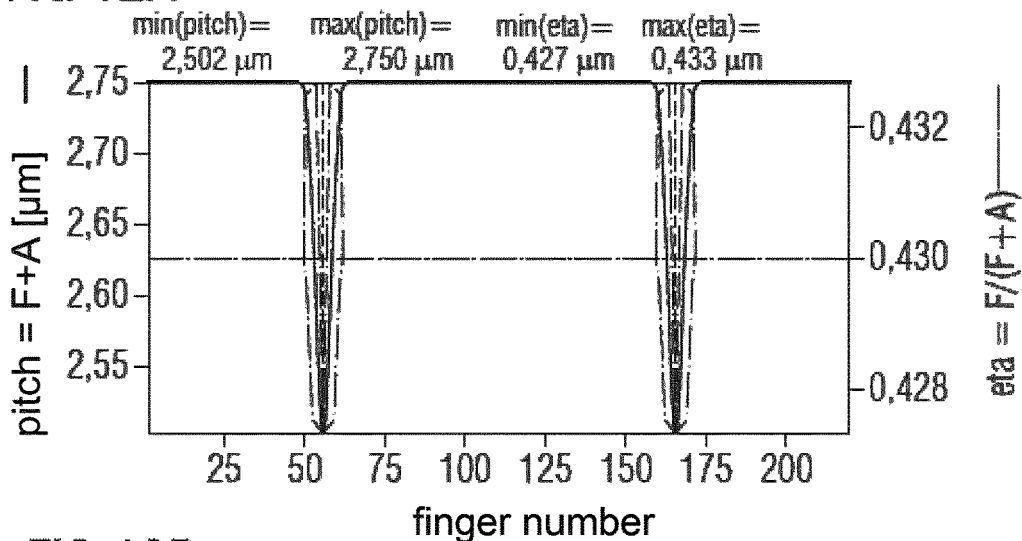
FIG. 12 shows the finger structure of resonator with the same finger period at transducer and reflector and with a linear chirp with a local minimum
Figure 12B:
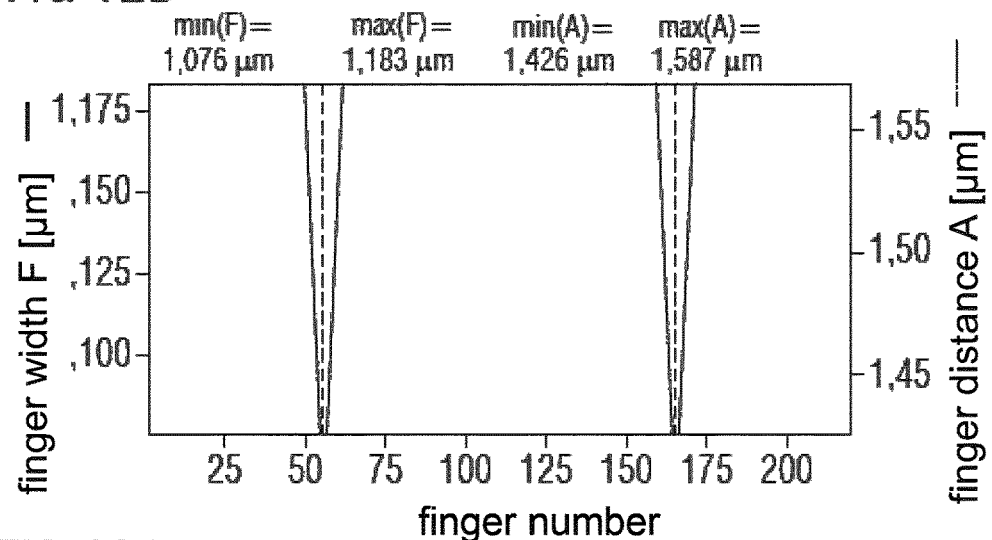
Figure 12C:
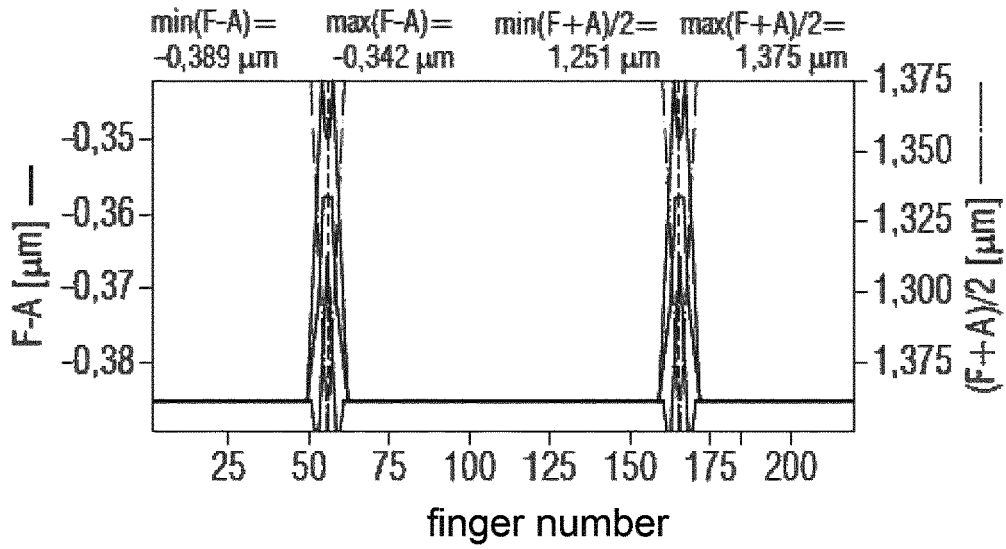

FIG. 12 shows the respective finger structure of the resonator of curve 2 in FIG. 11. The three diagrams a) to c) show different depictions of the geometric parameters relevant for width and distance of fingers. In this example a chirp is located symmetrically in the transition regions between the transducer and the reflectors. However, it is possible to shift the transition region slightly towards the middle of the transducer such that all finger with reduced finger distance belong to the transducer. Such a variant would cause no substantial performance deterioration of a filter using that resonator.

Figure 13:
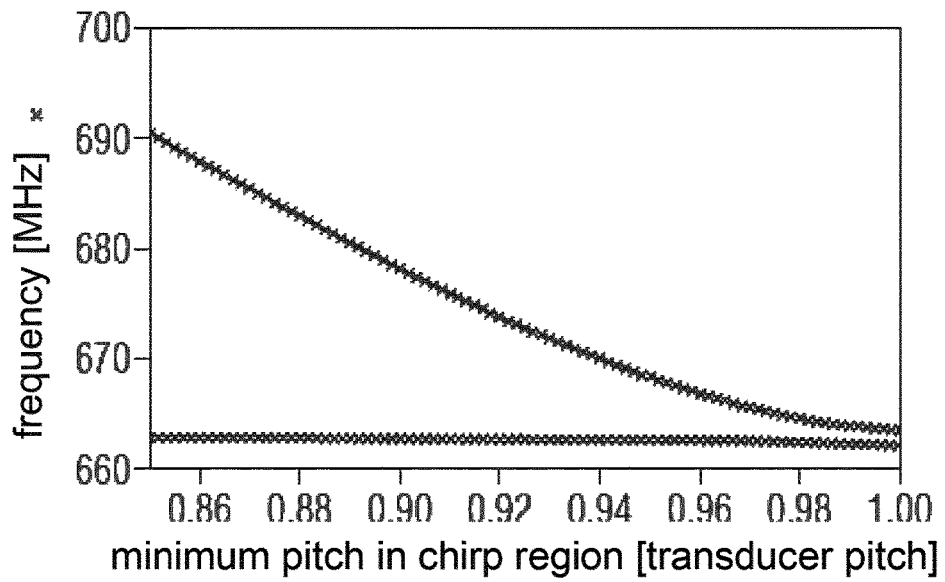
FIG. 13 shows the resonance frequencies of resonators having a linear chirp and the same finger period in transducer and reflector depicted in dependence of the value of the minimum finger period

FIG. 13 shows the course of the resonance frequencies of a resonator with a finger structure similar to that of figure ($p_{IDT}=p_{REF}$, 55-110-55 fingers, transition region comprises 5+5 fingers, uniform finger structure in non-transition region). The frequencies of the two resonances are depicted in dependence of the value of the minimum finger period at the local minimum. It can be seen that the greatest frequency difference between the two resonances appears at the lowest minimum finger period.

Figure 14:
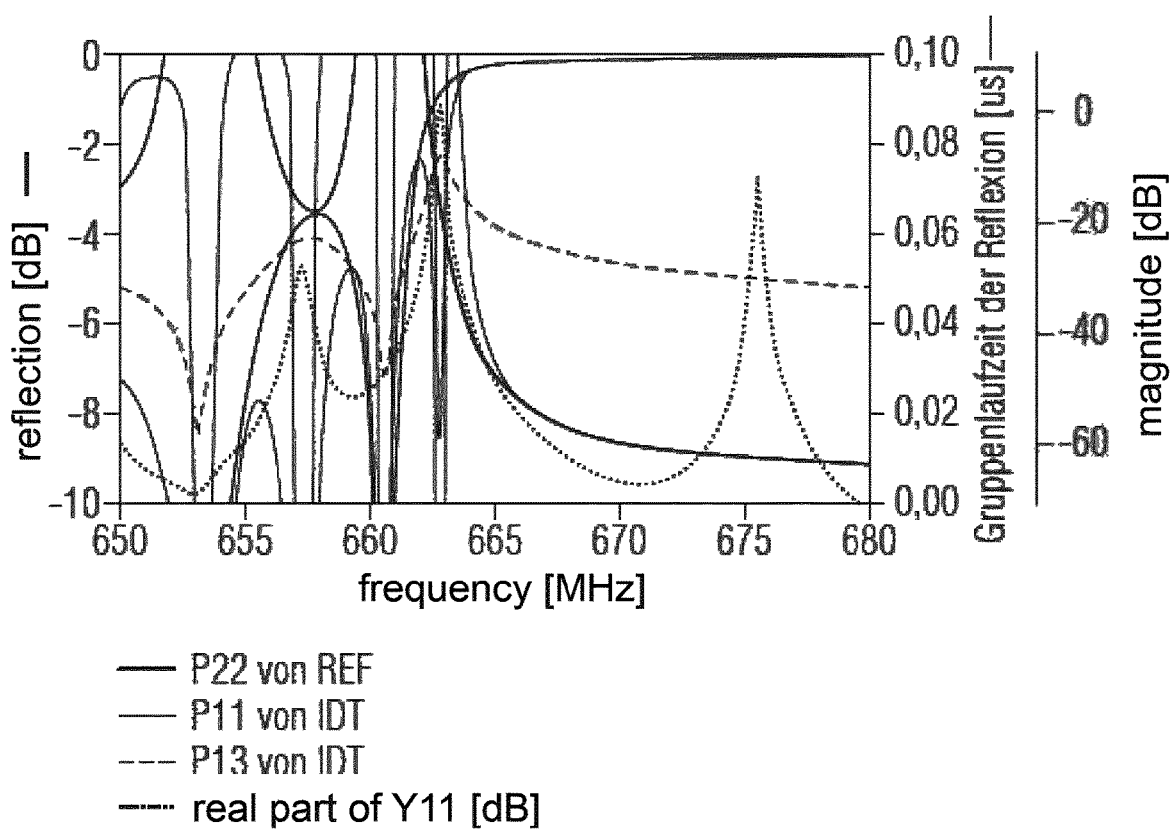
FIG. 14 shows characteristics of a reflector and a transducer having the same finger period in transducer and reflector and a reduced finger period in a linear chirped transition region

FIG. 14 shows characteristics of reflector and transducer having the same finger period in transducer and reflector and a reduced finger period in a linear chirped transition region as shown in FIG. 12.

Figure 15A:
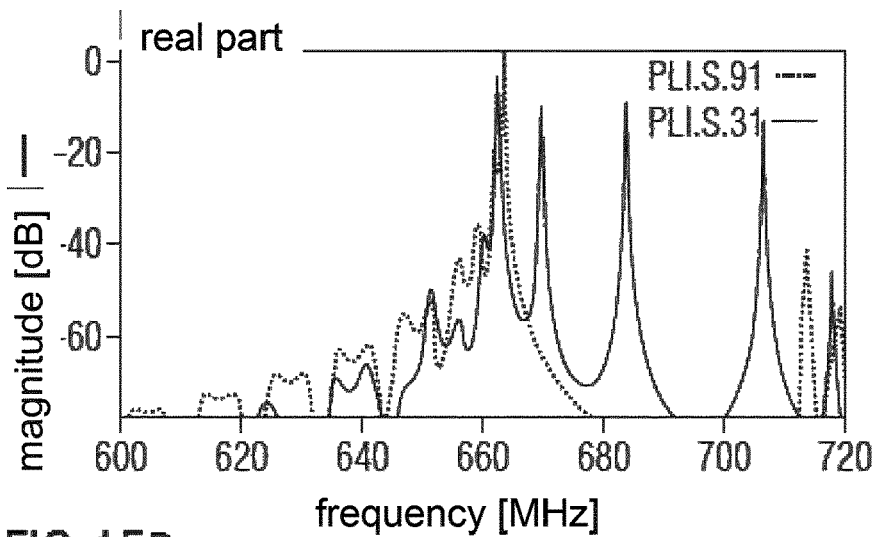
FIG. 15 shows the admittance of resonators with the same finger period in transducer and reflector and with a linear chirp with local minimum
Figure 15B:
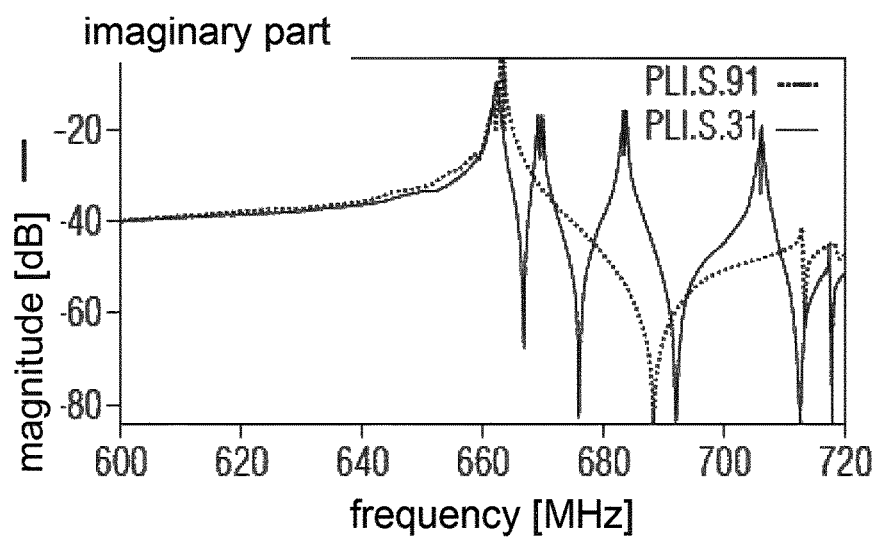
Figure 15C:
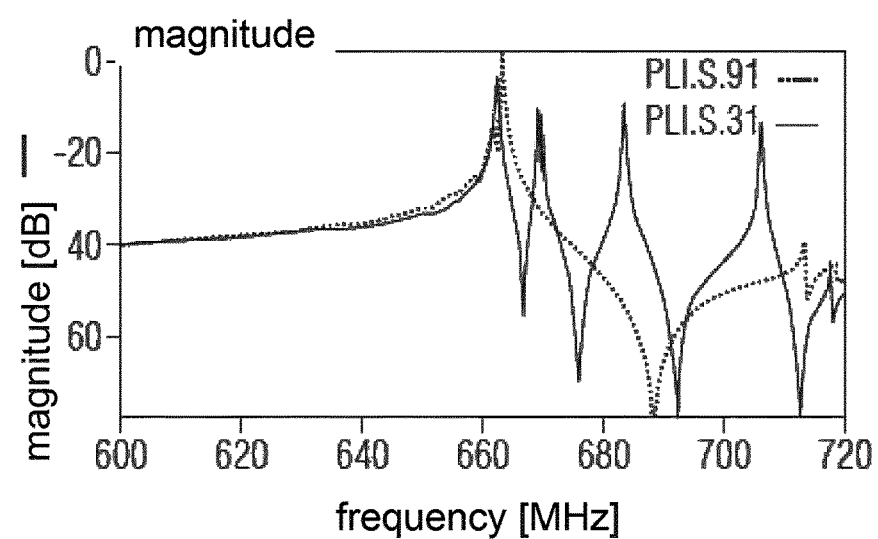

FIG. 15 shows the admittance of resonators with the same finger period in transducer and reflector without chirp (curve 1) compared with a respective resonator having a linear chirp with local minimum of about 0.9 times the mean finger period of IDT (curve 2). The three different diagrams a) to c) show real part, imaginary part and magnitude of admittance. The transition region comprises 20+20 fingers. Three additional distinct maxima appear in the admittance of curve 2 having nearly the same magnitude in a frequency range between the main resonance at about 660 MHz and 710 MHz. Other frequency ranges are of minor interest for the analysis and are not discussed.

Figure 16A:
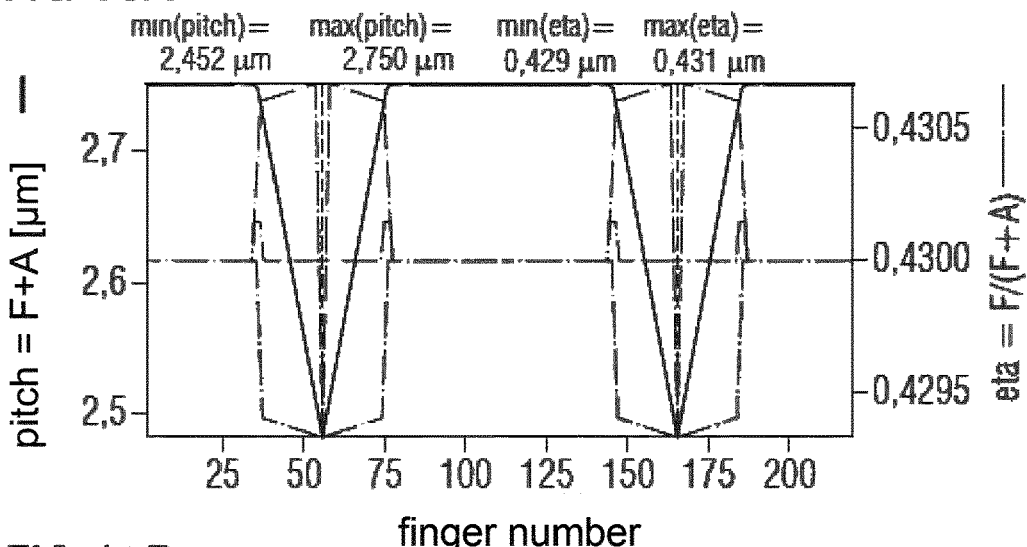
FIG. 16 shows the finger structure of a resonator with the same finger period in transducer and reflector and a linear chirp with a local minimum
Figure 16B:
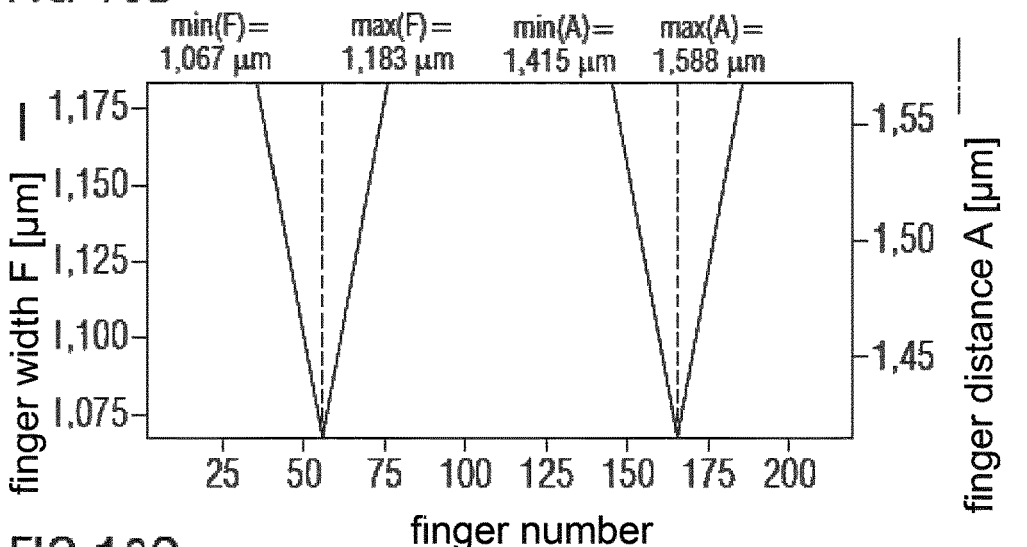
Figure 16C:
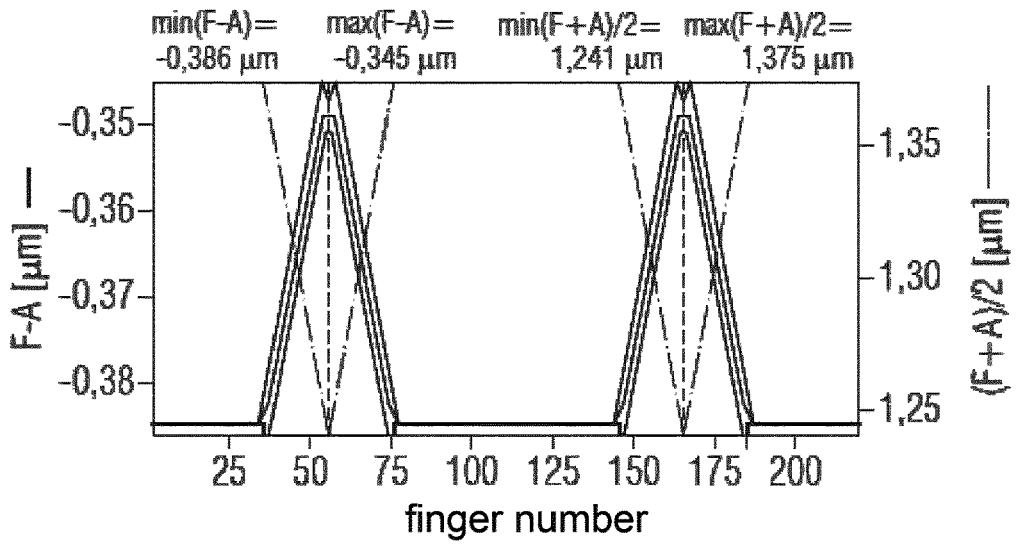

FIG. 16 shows the finger structure of the resonator according to curve 2 of FIG. 15. The three diagrams a) to c) show different depictions of the geometric parameters relevant for width and distance of fingers.

Figure 17:
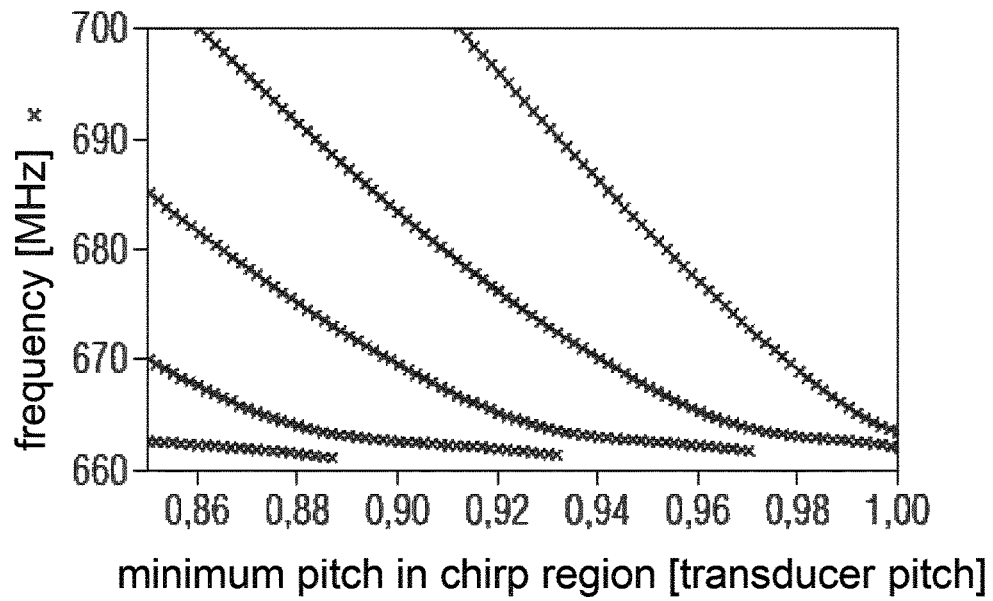
FIG. 17 shows the resonance frequencies of resonators having linear chirp with local minimum and the same finger period in transducer and reflector in dependence of the value of minimum finger period

FIG. 17 shows a correlation of the resonance frequencies of resonators having linear chirp with local minimum and the same finger period in transducer and reflector relative to the value of minimum finger period at its local minimum. For most of the relation $p_{min}/p_{IDT}$ four resonances are present at the same time.

Figure 18:
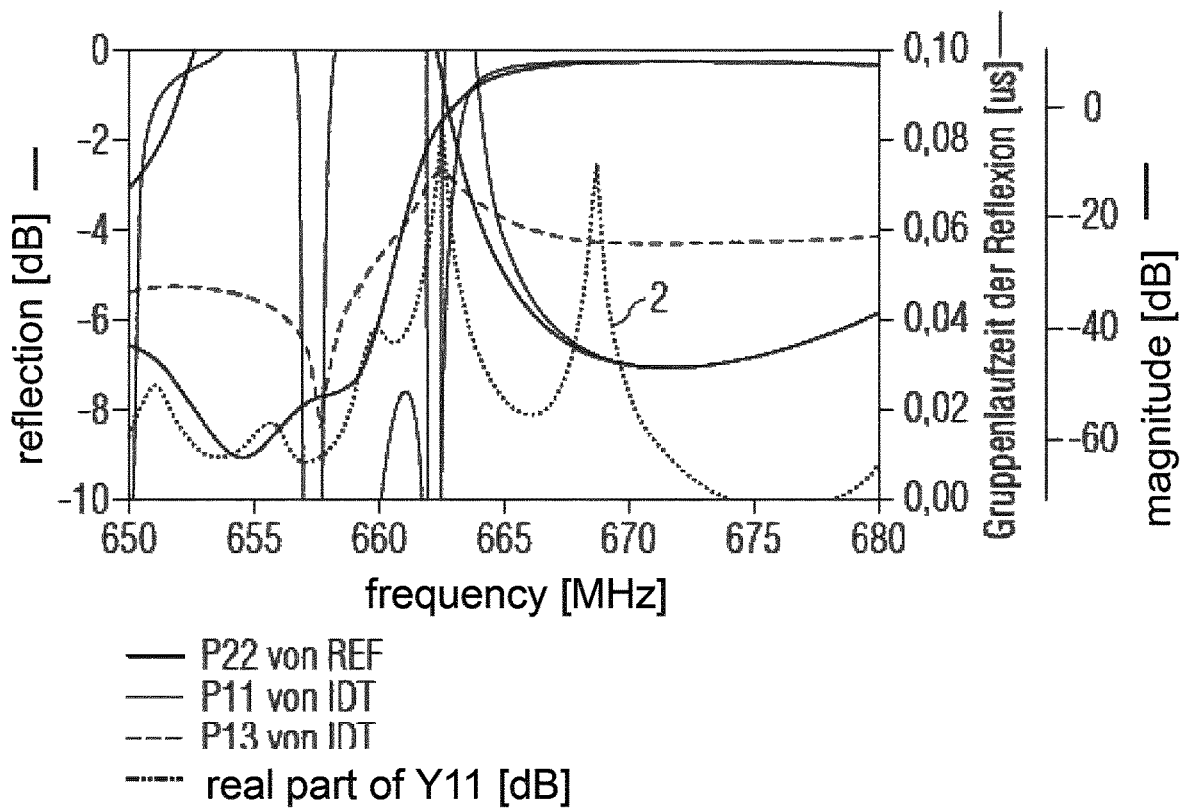
FIG. 18 shows characteristics of a reflector and a transducer with the same finger period in transducer and reflector and with a reduced finger period in a linear chirped transition region

FIG. 18 shows characteristics of a reflector and a transducer with the same finger period in transducer and reflector and with a reduced finger period in a linear chirped transition region. Further, conductance of the whole resonator comprising IDT and two reflectors (55-110-55 fingers) is depicted (curve 2).

Figure 19A:
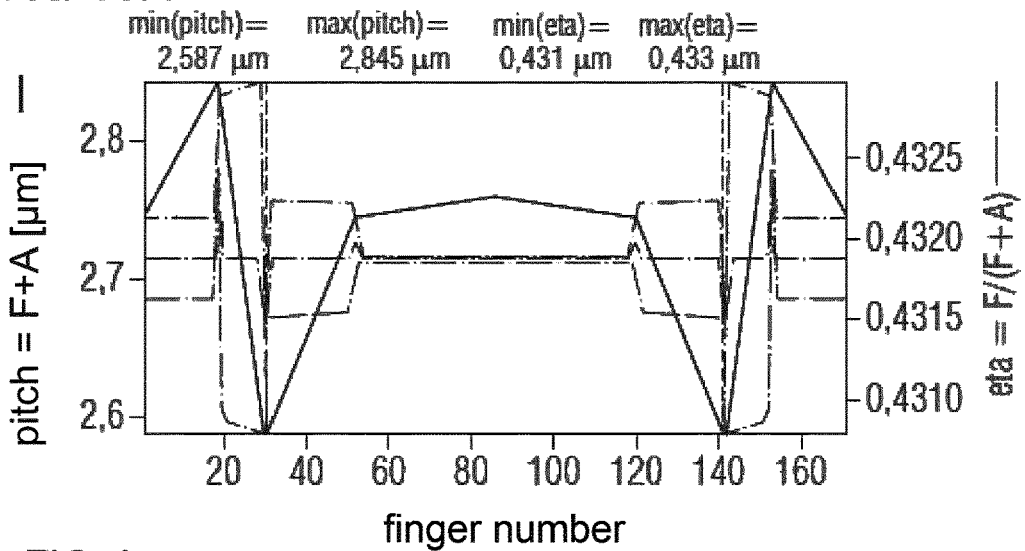
FIG. 19 shows a finger structure of a resonator with different finger periods in transducer and reflector, with local minimum in a linearly chirped region, with additional chirp in non-transition region of transducer and reflector, with local maximum of finger period in the middle of IDT and other local minima at outermost ends of the reflectors
Figure 19B:
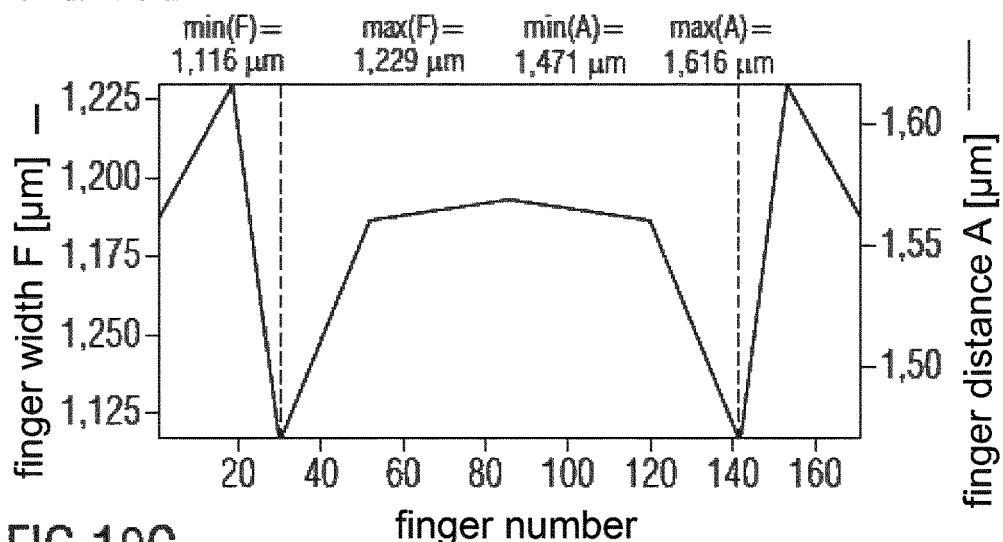
Figure 19C:
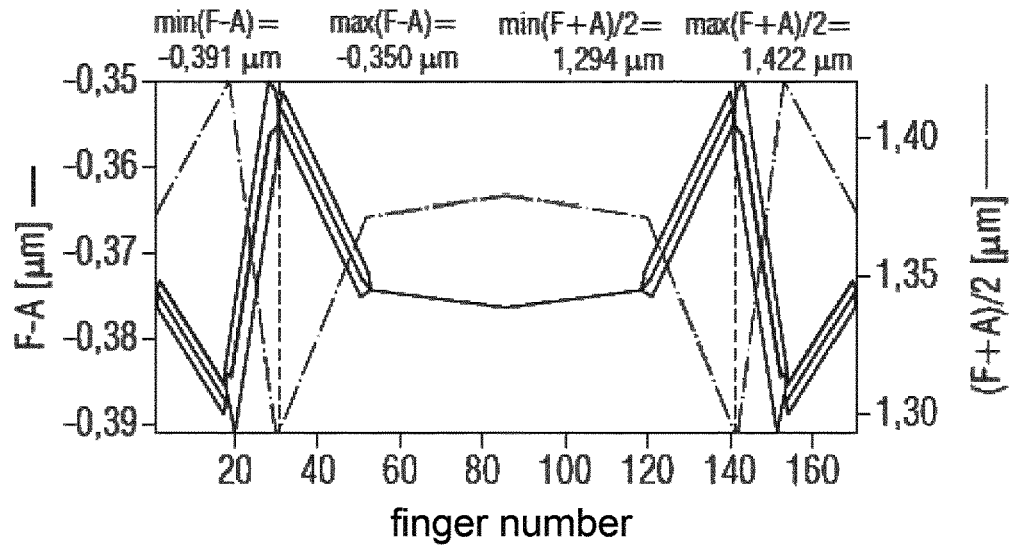

FIG. 19 shows a finger structure of a resonator according to an exemplary embodiment that is optimized for a given application. The three diagrams a) to c) show different depictions of the geometric parameters relevant for width and distance of fingers. The resonator has with different finger periods in transducer and reflector, a local minimum in a linear chirped transition region and with additional chirp in non-transition regions of transducer and reflector, with local maximum of finger period in the middle of IDT and other local minima at outermost ends of the reflectors. Transition regions comprise 10+20 fingers in reflector and IDT respectively. Such a resonator can be used as a resonator in parallel to the Rx filter of a duplexer for band 71.

Figure 20:
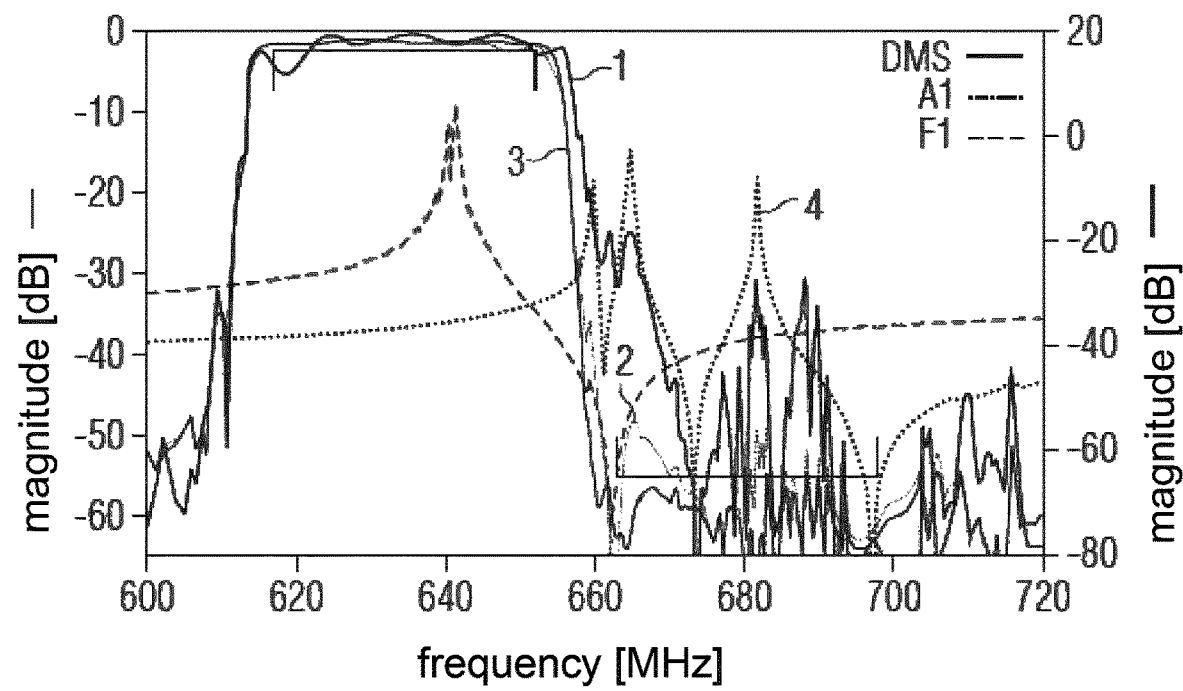
FIG. 20 shows characteristic of a resonator, of filter structures without any resonator, with resonator and with new multi-resonant resonator according to FIG. 19

FIG. 20 shows characteristic of a resonator, of filter structures without any resonator, with resonator and with new multi-resonant resonator according to FIG. 19. Curve 1 depicts the admittance of a DMS filter comprising two tracks of 9 transducers each. Curve 2 depicts the admittance of the same DMS filter to which a series resonator and the static capacitance of the resonator from FIG. 19 is connected in parallel at the Rx output. The structure curve 2 is assigned does not comply with a usual parallel resonator. Instead, only the static capacitance thereof has been regarded in order to make the curves comparable and to show the specific effect of the invention. Curve 3 shows the same circuit like curve 2 but with the conductance of the resonator according FIG. 19 at the Rx output additionally. The local maxima of the admittance of the parallel resonator in curve 4 are required to increase the selectivity in order to achieve curve 3 instead curve 2 as the Rx transfer function. The admittance maxima are set above the pass band of the respective filter to improve the upper stop band and not primarily to improve the right filter skirt. The parallel resonator is at the Rx output of the DMS filter and thus at maximum distance to the Tx filter of the duplexer (not shown). Hence, the maxima of admittance of the new parallel resonator do not negatively influence the pass band of the Tx filter lying above the depicted pass band 3 of the Rx filter.

Figure 21:
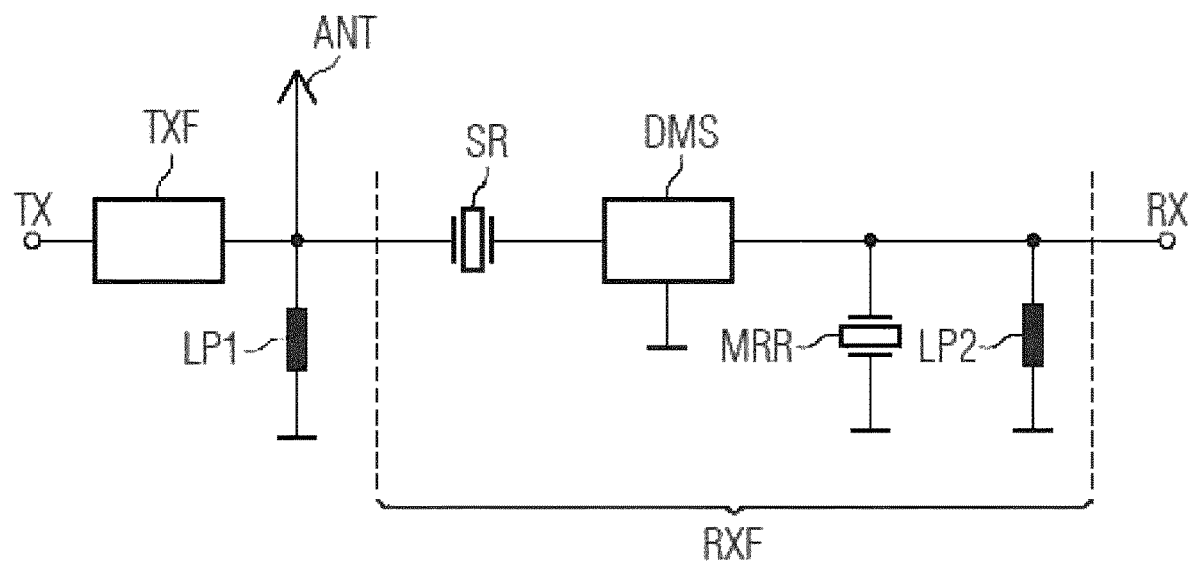
FIG. 21 shows a block diagram of a duplexer comprising the multiple resonant resonator circuited in parallel to the Rx filter.

FIG. 21 shows a block diagram of a duplexer comprising the multiple resonant resonator circuited in parallel to the Rx filter. The duplexer comprises a Tx filter TXF and an Rx filter RXF coupled in parallel to the antenna port ANT together with a first parallel inductance LP1. The Tx filter TXF may be embodied in any technology according to the art and has preferably a ladder type structure of SAW or BAW resonators. The Rx filter RXF comprises next to the antenna port ANT a series resonator SR for improving the right filter skirt and the stability against high signal amplitudes. Central filtering element is a DMS filter DMS. In an example the DMS may be embodied to comprise two tracks of nine transducers each.

Next to the DMS filter DMS the improved multiple resonant resonator MRR is circuited in parallel to the signal line that connects antenna port ANT and Rx section RX. The transfer curve of the whole filter RXF can be taken from FIG. 20 where it is depicted as curve 3.

At last, next to the Rx section RX a coil LP2 is circuited as a further parallel inductance LP2.

The invention has been explained with the help of a restricted number of embodiments. The embodiments show how substantial characteristics of a resonator behave with respect to possible variations. Combinations of features shown in different figures but not directly as a further embodiment are regarded to be within the scope of the invention. Hence, any resonator or filter circuit comprising a resonator can be varied with respect to the number of fingers, the length and course of the chirp in the transition region, the minimum finger period relative to the means IDT finger period, difference of finger periods in IDT and reflector and further chirps. Despite showing embodiments with symmetrical structure only asymmetrical resonator structures combining different features at both ends are possible too.

The invention claimed is:

1. A band pass filter, comprising:
   a first series resonator, connected to an input of the band pass filter at an antenna side thereof;
   a DMS track; and
   a SAW resonator comprising two reflectors and a transducer arranged between the reflectors, wherein a resonant space between the transducer and one of the two reflectors enables an occurrence of a first resonance and at least a second resonance of a comparable admittance to the first resonance, wherein the SAW resonator is circuited as a parallel resonator in a parallel branch at an output of the DMS track, a mean finger period of the parallel resonator being chosen smaller than a mean finger period of the first series resonator and assigned to a frequency above a pass band of the DMS track.

2. The band pass filter of claim 1, wherein:
   a local finger period is chirped on at least one of the two reflectors, the transducer, or both such that a local minimum of the local finger period forms in each of two transition regions that are between the transducer and one of the two reflectors; and the local finger period is defined at least in part by a number of outermost fingers on one or both of the transducer and at least one of the two reflectors.

3. The band pass filter of claim 2, wherein the local finger period continuously decreases towards one of the two reflectors across one of the two transition regions till reaching a minimum value and then continuously increases.

4. The band pass filter of claim 2, wherein the SAW resonator has a symmetric structure with a symmetry plane in a middle of the transducer, wherein two minima of the local finger period are situated at interfaces between each of the reflectors and the transducer.

5. The band pass filter of claim 2, wherein the local finger period across each of the two reflectors has a maximum at a beginning of at least one of the two transition regions, has a slope towards an outer end that faces away from the transducer where the local finger period has a value below the maximum.

6. The band pass filter of claim 1, wherein the band pass filter comprises a duplexer comprising a transmission filter and a reception filter.

7. The band pass filter of claim 6, wherein the duplexer duplexes reception and transmission signals of a frequency band in a 1 GHz domain.

8. A SAW resonator, comprising two reflectors and a transducer arranged between the reflectors, wherein:
a resonant space between the transducer and one of the two reflectors enables an occurrence of a first resonance and at least a second resonance of a comparable admittance to the first resonance,
a local finger period is chirped on at least one of the two reflectors such that a local minimum of the local finger period forms in each of two transition regions that are between the transducer and the at least one of the two reflectors, and is defined at least in part by a number of outermost fingers on one or both of the transducer and the at least one of the two reflectors; and
the local finger period across each of the two reflectors has a maximum at a beginning of at least one of the two transition regions and has a slope towards an outer end that faces away from the transducer where the local finger period has a value below the maximum.

9. The SAW resonator of claim 8, wherein:
the local finger period is defined by a distance between centers of two adjacent fingers and is chirped on the transducer and at least one of the two reflectors.

10. The SAW resonator of claim 8, wherein the local finger period continuously decreases towards the at least one of the two reflectors across the transition region till reaching a minimum value and then continuously increases.

11. The SAW resonator of claim 8, wherein the transition region comprises 10 to 40 fingers, the 10 to 40 fingers being chosen from reflector fingers and transducer fingers.

12. The SAW resonator of claim 8, wherein a mean finger period (PRM) of at least one of the two reflectors is greater than a mean finger period (PTM) of the transducer and 1.05 PTM>PRM>1.00 PTM.

13. The SAW resonator of claim 8, wherein the SAW resonator has a symmetric structure with a symmetry plane in a middle of the transducer, wherein two minima of the local finger period are situated at interfaces between each of the reflectors and the transducer.

14. The SAW resonator of claim 8, wherein the transition region is one of two transition regions that are between the transducer and a respective reflector of the two reflectors, wherein at least one of the two transition regions comprises a first number of reflector fingers (NF1Ref) and a second number of transducer fingers (NF2IDT), wherein NF1Ref<NF2IDT and the local finger period of the transducer has a maximum in a middle of the transducer wherein a respective slope of the local finger period between at least one of the two transition regions and the middle of the transducer is lower than a slope in at least one of the two transition regions.

15. The SAW resonator of claim 8, wherein the local finger period varies between a maximum (pmax) and a minimum (pmin) wherein $0.85\ \text{pmax} \leq \text{pmin} < \text{pmax}$ within the transition region.

\* \* \* \* \*